(12) United States Patent
Chang et al.

(10) Patent No.: US 10,475,900 B2
(45) Date of Patent: Nov. 12, 2019

(54) METHOD FOR MANUFACTURING A SEMICONDUCTOR DEVICE WITH A COBALT SILICIDE FILM

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Kai-Jiun Chang, Taoyuan (TW); Tsun-Min Cheng, Changhua County (TW); Chih-Chieh Tsai, Kaohsiung (TW); Jui-Min Lee, Taichung (TW); Yi-Wei Chen, Taichung (TW); Chia-Lung Chang, Tainan (TW); Wei-Hsin Liu, Changhua County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/869,005

(22) Filed: Jan. 11, 2018

(65) Prior Publication Data
US 2018/0212034 A1    Jul. 26, 2018

(30) Foreign Application Priority Data
Jan. 25, 2017    (CN) .......................... 2017 1 0060808

(51) Int. Cl.
*H01L 29/49*    (2006.01)
*H01L 21/285*    (2006.01)
*H01L 29/66*    (2006.01)
*H01L 27/108*    (2006.01)
*H01L 21/28*    (2006.01)

(52) U.S. Cl.
CPC .... *H01L 29/4975* (2013.01); *H01L 21/28052* (2013.01); *H01L 21/2855* (2013.01); *H01L 21/28518* (2013.01); *H01L 27/10855* (2013.01); *H01L 29/665* (2013.01)

(58) Field of Classification Search
CPC .......... H01L 29/4975; H01L 21/28518; H01L 29/665
See application file for complete search history.

(56) References Cited

U.S. PATENT DOCUMENTS

| | | | | |
|---|---|---|---|---|
| 6,066,563 A | * | 5/2000 | Nagashima | H01L 21/823842 257/E21.637 |
| 6,100,145 A | * | 8/2000 | Kepler | H01L 21/28052 257/E21.165 |
| 6,562,716 B2 | * | 5/2003 | Hashimoto | H01L 21/28052 257/E21.006 |

(Continued)

*Primary Examiner* — Bac H Au
(74) *Attorney, Agent, or Firm* — Winston Hsu

(57) ABSTRACT

A method for manufacturing a semiconductor device with a cobalt silicide film is provided in the present invention. The method includes the steps of providing a silicon structure with an interlayer dielectric formed thereon, forming a contact hole in the interlayer dielectric to expose the silicon structure, depositing a cobalt film on the exposed silicon structure at a temperature between 300° C.-400° C., wherein a cobalt protecting film is in-situ formed on the surface of the cobalt film, performing a rapid thermal process to transform the cobalt film into a cobalt silicide film, and removing untransformed cobalt film.

9 Claims, 2 Drawing Sheets

(56) References Cited

U.S. PATENT DOCUMENTS

| | | | |
|---|---|---|---|
| 7,105,443 B2* | 9/2006 | Ahn | H01L 21/28518 |
| | | | 257/754 |
| 8,187,970 B2* | 5/2012 | Ganguli | C23C 16/18 |
| | | | 257/E21.199 |
| 9,859,123 B1* | 1/2018 | Wu | H01L 21/28518 |
| 2004/0132268 A1* | 7/2004 | Koo | C23C 14/021 |
| | | | 438/583 |
| 2008/0081472 A1 | 4/2008 | Tanaka | |
| 2015/0262870 A1* | 9/2015 | Lin | H01L 23/5226 |
| | | | 257/751 |

* cited by examiner

METHOD FOR MANUFACTURING A SEMICONDUCTOR DEVICE WITH A COBALT SILICIDE FILM

BACKGROUND OF THE INVENTION

1. Field of the Invention

The present invention relates generally to a method for manufacturing a semiconductor device, and more specifically, to a method for manufacturing a semiconductor device with a cobalt silicide film.

2. Description of the Prior Art

With the rapid growth of circuit integration in semiconductor devices and the advancing in fabrication technology, the minimum feature size is continuously deceasing. The contact area provided in circuit layout for connecting individual device is also deceasing, especially in high-density memory cells, such as dynamic random access memory (DRAM). In such a case, the property of contact resistance becomes more important in the electrical performance of devices.

To accelerate the operating speed of devices and consider the factors of wiring miniaturization and thermal resistance, a silicide process is generally performed at the connection between metal wiring and source/drain or gate to form metal silicide, ex. cobalt silicide, to reduce the contact resistance. For example, in the DRAM structure, the bit line containing metal composition is connected to source/drain of the transistor through poly-silicon contact plug. The cobalt silicide formed therebetween would provide excellent ohmic contact characteristic.

Common approach adopted in the semiconductor industry is to form titanium nitride (TiN) capping layer on unreacted cobalt film to prevent cobalt oxidation. However, since TiN-based capping layer is difficult to be removed after high-temperature silicide reaction, it is liable to form defects of flake-type residue on the surface. Therefore, it is necessary to improve the currently available silicide process in the semiconductor process in order to solve this issue.

SUMMARY OF THE INVENTION

To solve the above-mentioned problem, a novel method for forming cobalt silicide films is provided in the present invention. In the method, a cobalt protective layer is in-situ and concurrently formed on the surface when the unreacted/untransformed cobalt layer is formed, so that no additional titanium nitride capping layer is required to prevent the oxidation of cobalt.

The purpose of the present invention is to provide a novel method for forming cobalt silicide, wherein the step of method includes providing a silicon structure with an interlayer dielectric formed thereon, forming a contact hole in the interlayer dielectric to expose the silicon structure, depositing a cobalt film on the exposed silicon structure at a temperature between 300° C.-400° C., wherein a cobalt protecting film is in-situ formed on the surface of cobalt film, performing a rapid thermal process to transform the cobalt film into a cobalt silicide film, and removing untransformed cobalt film.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
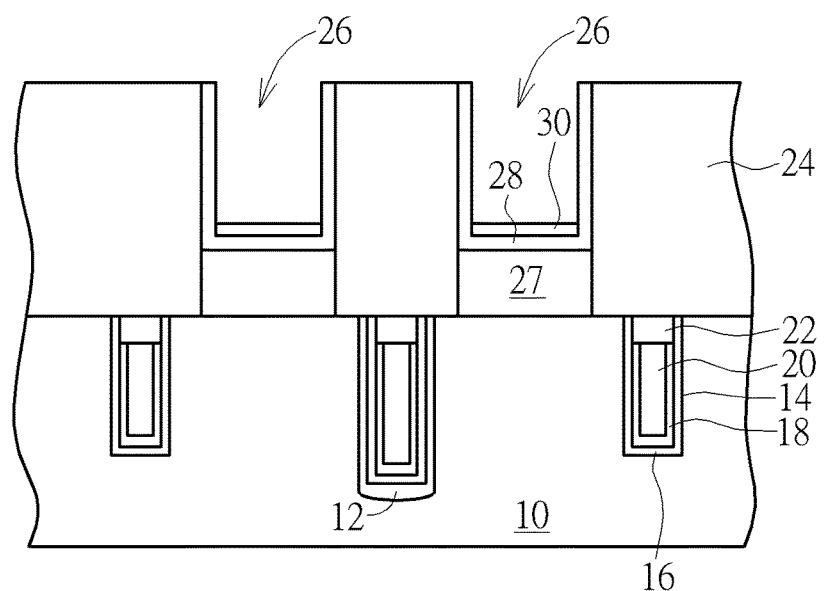
FIGS. 1-3 are schematic cross-sectional views illustrating the process flow of manufacturing a semiconductor device with a cobalt silicide film in accordance with the embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Figure 2:
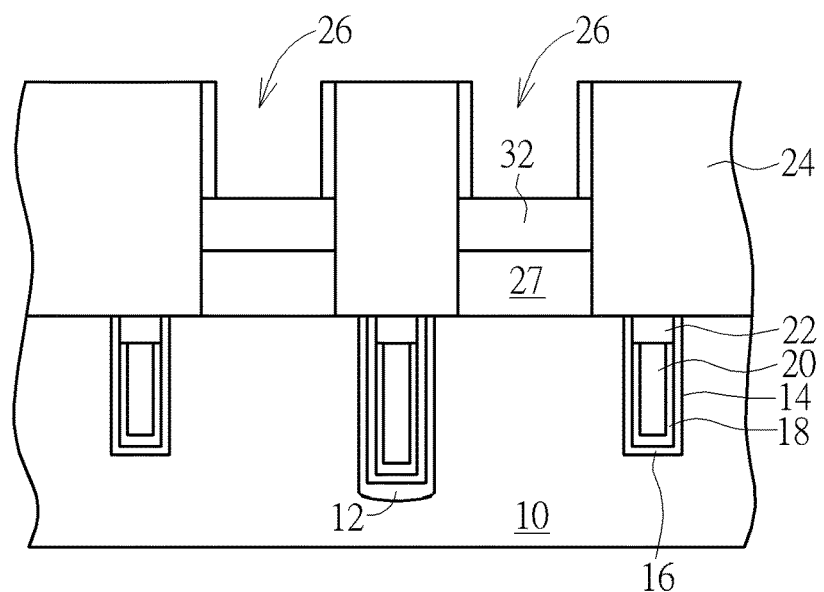
Figure 3:
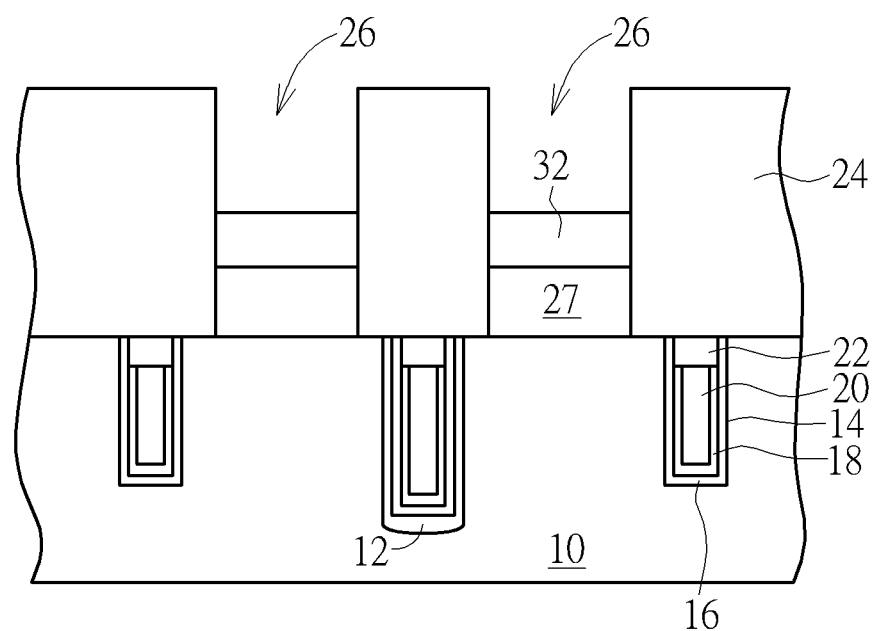

FIGS. 1-3 are schematic cross-sectional views illustrating the process flow of manufacturing a semiconductor device with cobalt silicide films in accordance with the embodiment of present invention. The following detailed description is made with reference to those accompanying drawings to explain the process steps of forming cobalt silicide films.

Please refer to FIG. 1. The buried wordline channel access transistor (BWCAT) is used in the embedment to exemplify the method for forming the cobalt silicide film in the present invention. First, a substrate 10, such as a silicon substrate, is provided. Multiple trenches 14 are formed on the substrate 10 in advance for accommodating buried wordlines in later process. Device insulating layer 12, such as a shallow trench isolation (STI), may be formed in the substrate to separate and define individual devices or regions. A gate insulating layer 16 is then formed on the bottom and sidewall of trench 14. The gate insulating layer 16 may be formed by performing a thermal oxidation process to the silicon substrate 10. The gate insulating layer 16 formed on the surface of substrate 10 may be removed by currently available etch process in later process. A barrier layer 18 may be formed on the surface of gate insulating layer 16 by chemical vapor deposition (CVD) process or atomic layer deposition (ALD) process. In the embodiment, the barrier layer 18 may be formed of the materials including TiN, Ti/TiN, WN, W/WN, Ta/TaN, TaN, TaSiN, WSiN, or a combination thereof.

Refer again to FIG. 1. A metal layer 20 is then formed in the trench 14 by the steps of forming a metal layer burying in the trench 14 on the substrate and performing a chemical mechanical polishing (CMP) to remove the metal portion outside the trench 14. In the embodiment, the metal layer may be formed by using the materials including W, Al, Cu, Mo, Ti, Ta, Ru, or a combination thereof. In the embodiment, the barrier layer 18 and the metal layer 20 collectively form a buried wordline. The buried wordline extends through the active region and the device insulating layer in the substrate. Thereafter, a capping layer 22 may be optionally formed on the gate electrode layer 18 and the metal layer 20 to protect the buried wordline structure. The top surface of the capping layer 22 is flush with the surrounding surface without protruding from the substrate. The capping layer 22 may be formed by insulating material, such as silicon oxide or silicon nitride.

After the capping layer 22 is formed, an interlayer dielectric 24, such as an oxide layer, is then formed on entire substrate 10, and contact openings 26 are formed in the interlayer dielectric 24. The contact openings 26 is set between two wordline structures and extends through the interlayer dielectric 24 to expose the silicon substrate 10 thereunder, wherein source/drain regions may already be defined in the substrate 10. Refer again to FIG. 1. After the silicon substrate 10 is exposed, an epitaxial process is performed to grow an epitaxial layer 27, such as a polysilicon layer or an amorphous silicon layer, on the exposed silicon substrate 10. Thereafter, a conformal cobalt film 28 is formed on the epitaxial layer 27 and covers the sidewall of the contact openings 26 and the active region 12 of the exposed silicon substrate 10 in the opening.

Please note that, in the present invention, the cobalt film 28 is formed by high-temperature physical vapor deposition (PVD) process, for example, by using a sputtering process at process temperature between 300° C.-400° C. This approach is distinctive from prior art that the cobalt film is always formed at room temperature. In this process step, the advantage of forming cobalt film at high temperature is that a portion of cobalt film 28 would in-situ react with the underlying silicon and transforms directly into cobalt silicide ($CoSi_2$) 30 during the formation of cobalt film 28, especially the surface portion of cobalt film 28. Other portion of cobalt film 28 may include untransformed cobalt and the silicide in CoSi phase which is not completely transformed. At this stage, the transformed cobalt silicide 30 may be considered as a cobalt-based protecting film to prevent the oxidation of cobalt formed in this process. Accordingly, no additional titanium nitride layer like the one used in prior art is required on the cobalt surface to prevent the oxidation in the process of present invention. The advantage and non-obviousness of this step is to form the cobalt protecting layer concurrently with the cobalt film 28 without changing process chambers or performing additional step to form the titanium nitride layer in prior art.

Please refer to FIG. 2. After the cobalt film 28 is formed, a rapid thermal process (RTP) is then performed under an inert atmosphere at a process temperature, for example, between 700° C.-850° C., so that the unreacted cobalt in the opening and the silicide in CoSi phase which is not completely transformed would completely react to form a complete cobalt silicide layer 32, thereby further reducing the resistance of device. The cobalt portion not contacting with silicon on the sidewall of opening would not react. In conventional process step, two rapid thermal processes (RTP1 and RTP2) are required to completely transform the cobalt film into cobalt silicide. In comparison thereto, the method of present invention forms the cobalt film and concurrently/in-situ transforms a portion of cobalt film into cobalt silicide at high temperature in the beginning of the process. Through this approach, not only the advantage of anti-oxidation is achieved, the remaining unreacted cobalt film may also be transformed into cobalt silicide in single rapid thermal process without additional rapid thermal process like the one adopted in prior art.

Please refer to FIG. 3. After the cobalt silicide is formed in rapid thermal process, a cleaning step is performed to remove the unreacted cobalt film, such as the cobalt film on the sidewall of opening. Unlike prior art, no additional titanium protecting layer is required in the process of present invention, so that this cleaning step may use unadulterated concentrated sulfuric acid (with a concentration between 94%-98%) without mixing any oxidant (ex. hydrogen peroxide) to remove the unreacted cobalt film. Only the cobalt silicide film 32 on the surface of silicon substrate would remain in the opening to function as an intermediary structure between contact plugs and silicon substrate and to provide excellent ohmic contact characteristic. Furthermore, since the present invention adopts only single rapid thermal process, naturally, only one cleaning step is required in the process to obtain the desired cobalt silicide layer. This feature is quite distinctive from the complex process in prior art, which two rapid thermal processes are adopted and there may even be more potential cleaning processes needed to remove the residue.

In later process, contact plugs may be formed in the opening like the conventional steps, such as storage node contact plugs and wirings connected thereon. For the clarity of disclosure and not obscuring the key points of the present invention, relevant description and drawings are herein omitted without going any further.

In summary, since the method of present invention adopts high temperature process to concurrently/in-situ forms cobalt silicide protecting film, additional titanium nitride protecting layer like the one adopted in prior art is not required in the process of the present invention, so that the issue of flake-type defects caused by titanium nitride residue after cleaning step is properly solved, and several routine, redundant process steps may be skipped. This is conclusively a method with novelty and non-obviousness provided by the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device with a cobalt silicide film, comprising:

providing a silicon structure, wherein an interlayer dielectric is formed on said silicon structure;

forming a contact hole in said interlayer dielectric to expose said silicon structure;

depositing a cobalt film on said exposed silicon structure at a temperature between 300° C.–400° C., wherein a cobalt protecting film is in-situ formed on the exposed surface of said cobalt film, and said cobalt film is between said silicon structure and said cobalt protecting film;

performing a rapid thermal process to transform said cobalt film into a cobalt silicide film; and removing untransformed cobalt film, wherein no additional rapid thermal process is performed after said untransformed cobalt film is removed.

2. The method for manufacturing a semiconductor device with a cobalt silicide film of claim 1, wherein said cobalt protecting film is cobalt silicide, and said cobalt film is a continuous intact conformal layer before said rapid thermal process is performed to transform said cobalt film into said cobalt silicide film.

3. The method for manufacturing a semiconductor device with a cobalt silicide film of claim 1, wherein said cobalt film is deposited conformally on said contact hole and said exposed silicon structure.

4. The method for manufacturing a semiconductor device with a cobalt silicide film of claim 1, wherein the step of forming said cobalt film comprises performing a cleaning step with concentrated sulfuric acid to remove said untransformed cobalt film.

5. The method for manufacturing a semiconductor device with a cobalt silicide film of claim 4, wherein the concentration of said concentrated sulfuric acid is between 94%-98%.

6. The method for manufacturing a semiconductor device with a cobalt silicide film of claim 1, wherein the temperature of said rapid thermal process is between 700° C.–850° C.

7. The method for manufacturing a semiconductor device with a cobalt silicide film of claim 1, further comprising performing an epitaxial growth process to form an epitaxial layer on said exposed silicon structure before said cobalt film is deposited.

8. The method for manufacturing a semiconductor device with a cobalt silicide film of claim 1, wherein no additional titanium nitride protective layer is formed on said cobalt film.

9. The method for manufacturing a semiconductor device with a cobalt silicide film of claim 1, further comprising forming a contact plug on said cobalt silicide film.

\* \* \* \* \*